(12) United States Patent
Minami et al.

(10) Patent No.: US 6,675,188 B1
(45) Date of Patent: Jan. 6, 2004

(54) COUNTER CONTROL APPARATUS AND CONTROL METHOD THEREOF

(75) Inventors: Masahiro Minami, Kanagawa (JP); Shigekazu Ootsuka, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 478 days.

(21) Appl. No.: 09/696,823

(22) Filed: Oct. 26, 2000

(30) Foreign Application Priority Data

Oct. 29, 1999 (JP) .......................................... 11-309259

(51) Int. Cl.$^7$ .............................................. H03K 21/14
(52) U.S. Cl. ......................................... 708/672; 377/37
(58) Field of Search .............................. 708/672; 377/37

(56) References Cited

U.S. PATENT DOCUMENTS 4,341,950 A * 7/1982 Kyles et al. ................... 377/28
4,477,918 A * 10/1984 Nossen et al. ................ 377/37
4,589,019 A * 5/1986 Dischert et al. ............. 348/688

FOREIGN PATENT DOCUMENTS

| JP | 57-107641 | 7/1982 |
|---|---|---|
| JP | 4-369726 | 12/1992 |
| JP | 05-191406 | 7/1993 |
| JP | 6-301440 | 10/2000 |
| KR | 1998-059774 | 10/1998 |
| KR | 10-0214399 | 8/1999 |

* cited by examiner

*Primary Examiner*—David H. Malzahn
(74) *Attorney, Agent, or Firm*—Katten Muchin Zavis Rosenman

(57) ABSTRACT

In a counter readout control apparatus comprising a plurality of counters, in which an upper-order counter performs a counting operation upon receiving a carry from a lower-order counter, this apparatus further comprising, a first means for resetting each flag storing memory in which a carry of each counter, with an exception of an uppermost-order counter, is stored (Step S21), a second means for sequentially reading out the plurality of counters from an upper-order counter to a lower-order counter (Step S22 to S25), a third means for, after reading each counter value by means of the second means, testing as to whether the carry is set or not in the flag storing memory (Step S26 to S29), and a fourth means for, in the case in which the carry is set in the flag storing memory, resetting the flag storing memory having the carry (Step S27A, S28A, S29A) and performing a re-read operation only of counters having an order higher than an order of a counter which has been changed due to a reception of the carry (Step S22 to S25).

2 Claims, 6 Drawing Sheets

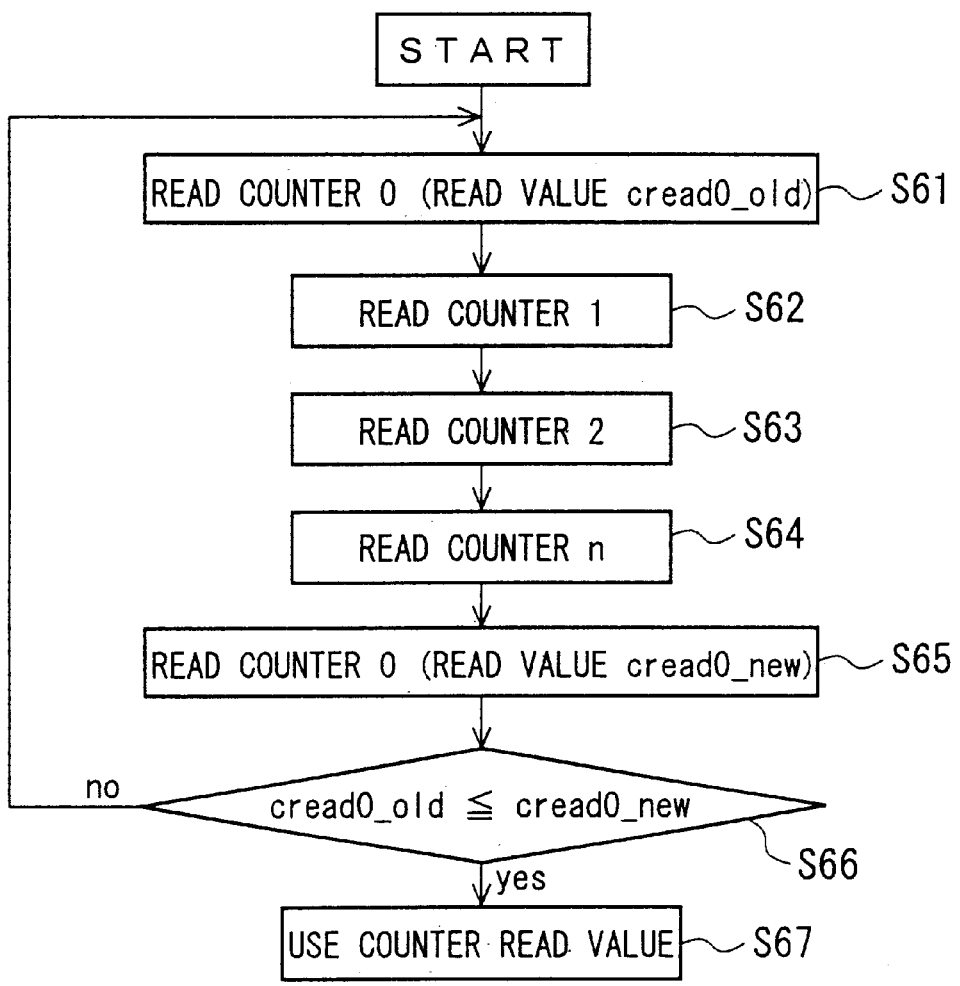

COUNTER CONTROL APPARATUS AND CONTROL METHOD THEREOF

BACKGROUND OF THE INVENTION

1. Field of the Invention

The present invention relates to a counter readout control apparatus and control method therefor, which is suitable for readout of a counter value having a bit width that is larger than the bit width that can be read by a CPU.

2. Related Art

In the prior art, when reading a counter value having a bit width that is larger than a data bus, it was necessary to divide the read cycle into a number of parts. For this reason, if there was a carry to an upper-order counter from the lowermost-order counter during the reading of all the counters, there was no assurance of the read value. Therefore, this problem was solved using software. For example, after reading all of the counters, the lowermost-order counter value was read, and a software check was made of whether the counter value of the lowermost-order counter is within a reasonable range, so as to make a judgment as to whether or not the read data is valid. More specifically, in the case of a lowermost-order counter having eight bits, if the first read value is between EFH and FFH, and if the second read value is between 00H and 0FH, the judgment is made that a carry has occurred to an upper-order counter from the lowermost-order counter, the overall counter value being taken as invalid. In other cases, however, the software takes the counter value as being valid.

FIG. 6 is a flowchart showing the read operation of a counter value in the prior art. In FIG. 6, the first read value is cread0_old, and the second read value is cread0_new, so that in step S66, the second read value cread0_new is compared with the first read value cread0_old. When performing this processing using software, it is possible that exceptional processing or the like occurs during reading of the entire counter, so that the desired software processing such as re-reading and the like is not performed for a long period of time. That is, software processing can become complex and, because of external influences, there are cases in which the counter value is not assured.

Accordingly, it is an object of the present invention to improve on the above-noted drawbacks of the prior art, by particularly providing a novel counter readout control apparatus and control method therefor that enables accurate reading of a counter value.

SUMMARY OF THE INVENTION

To achieve the above-noted object, the present invention has the following basic technical constitution.

Specifically, a first aspect of the present invention is a counter readout control apparatus comprising a plurality of counters, in which an upper-order counter performs a counting operation upon receiving a carry from a lower-order counter, the apparatus further comprising, a first means for resetting each flag storing memory in which a carry of each counter, with an exception of an uppermost-order counter, is stored (Step S21), a second means for sequentially reading out the plurality of counters from an upper-order counter to a lower-order counter (Step S22 to S25), a third means for, after reading each counter value by means of the second means, testing as to whether the carry is set or not in the flag storing memory (Step S26 to S29), and a fourth means for, in the case in which the carry is set in the flag storing memory, resetting the flag storing memory having the carry (Step S27A, S28A, S29A) and performing a re-read operation only of counters having an order higher than an order of a counter which has been changed due to a reception of the carry (Step S22 to S25).

A second aspect of the present invention is a counter readout control method for a counter comprising a plurality of counters, in which an upper-order counter performs a counting operation upon receiving a carry from a lower-order counter, the method comprising, a first step of resetting each flag storing memory in which a carry of each counter, with an exception of an uppermost-order counter, is stored, a second step of sequentially reading out the plurality of counters from an upper-order counter to a lower-order counter, a third step of, after reading each counter value by means of the second means, testing as to whether the carry is set or not in the flag storing memory, and a fourth step of, in the case in which the carry is set in the flag storing memory, resetting the flag storing memory having the carry and performing a re-read operation only of counters having an order higher than an order of a counter which has been changed due to a reception of the carry.

BRIEF DESCRIPTIONS OF THE DRAWINGS

FIG. 6 is a flowchart showing the operation in the prior art.

DETAILED DESCRIPTION OF THE PREFERRED EMBODIMENTS

Preferred embodiments of a counter readout control apparatus and control method therefor are describe in detail below, with references made to relevant accompanying drawings.

These drawings show a readout control apparatus for a plurality of counters C0 through Cn. An upper-order counter of this readout control apparatus performs a counting operation upon receiving a carry signal from a lower-order counter, this readout control apparatus being provided with a readout control means 1 that sequentially reads the plurality of counters C0 through Cn, starting at the upper-order counter and proceeding to a lower-order counter, and memory means F0 through Fn−1, for storing carry signals from each counter of the plurality of counters C0 through Cn, with the exception of the uppermost-order counter Cn. In the present invention, the readout control means 1, immediately before reading of each of the counters C0 through Cn, causes the reset condition within the memory means F0 to Fn−1, and the memory means F0 to Fn−1 are implemented by flip-flop circuits.

The first embodiment of the present invention is described in further detail below.

Figure 1:
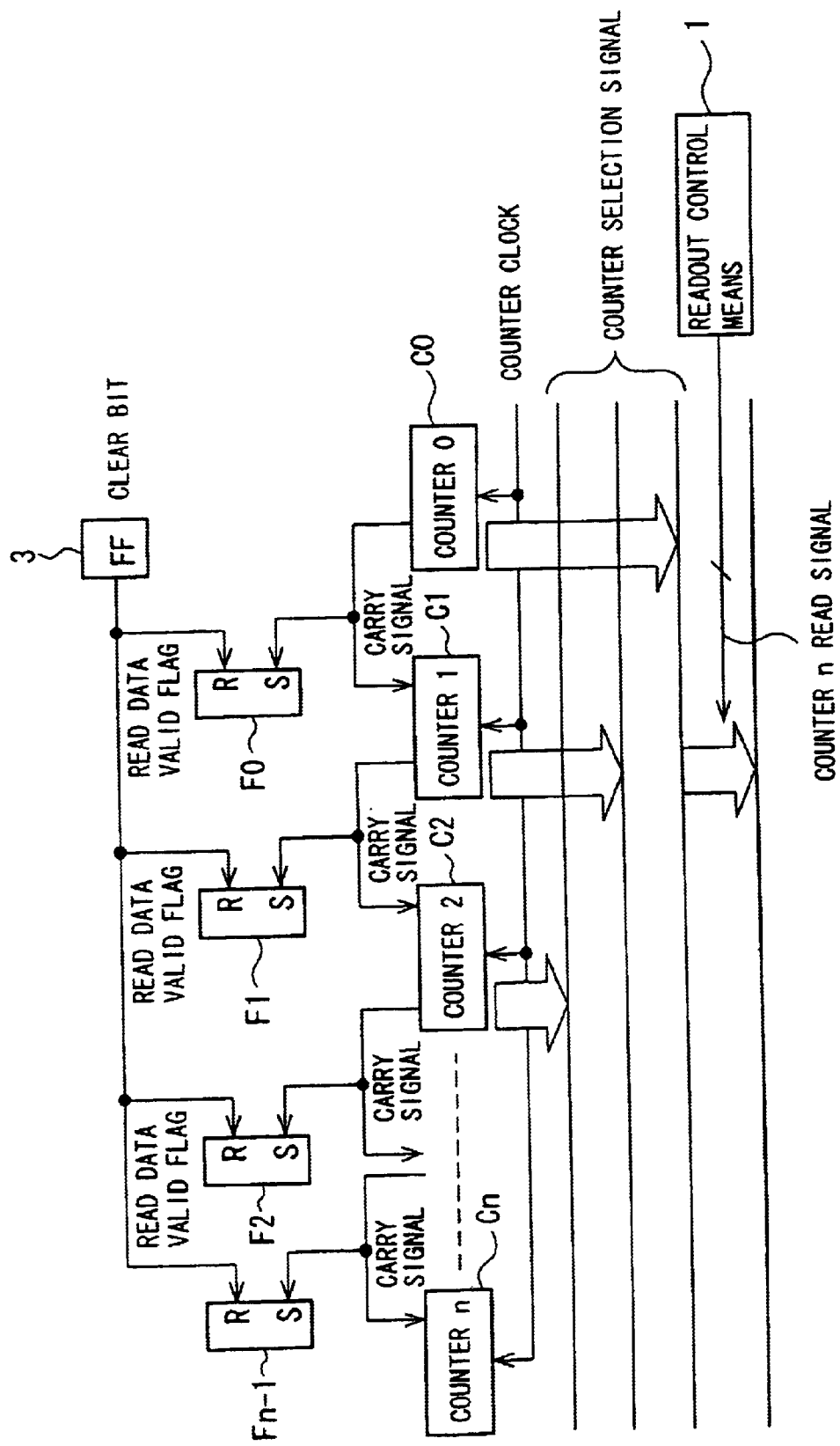
FIG. 1 is a block diagram of a first embodiment of a counter readout control apparatus according to the present invention.
Figure 2:
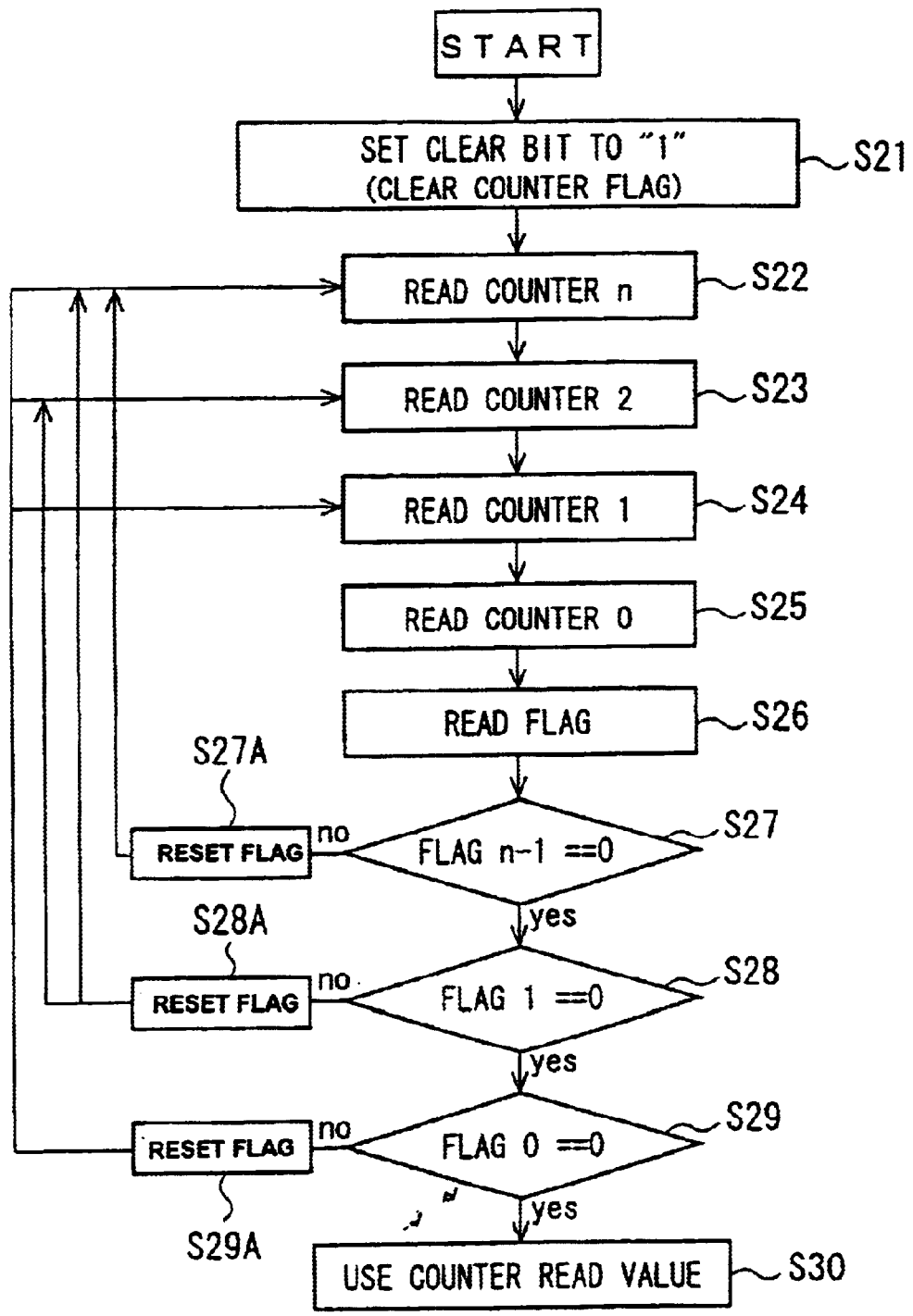
FIG. 2 is a flowchart of the first embodiment of the present invention.

The flags F0 to Fn−1 are reset by a clear bit 3 set at the time of reading. In the case shown in FIG. 1, in which there is an n-bit counter, the operation is as shown in the flowchart of FIG. 2.

First, when a read signal is input, the clear bit 3 is set to "1", and the read data valid flags F0 to Fn−1 for each counter are cleared (Step S21). Reading of the counter proceeds from the uppermost-order counter Cn, and when reading of the lowermost-order counter C0 is completed (Step S22 to S26), the read data valid flags F0 to Fn−1 are read (Step S27, S28, S29). If a flag is "1", this indicates that a carry has occurred, in which case the counters having orders that are greater than the counter in which the carry occurred are re-read, so as to assure the count data. By doing this, it is not necessary, as was done in the past, to re-read all the counters, thereby lightening the burden on software.

Figure 3:
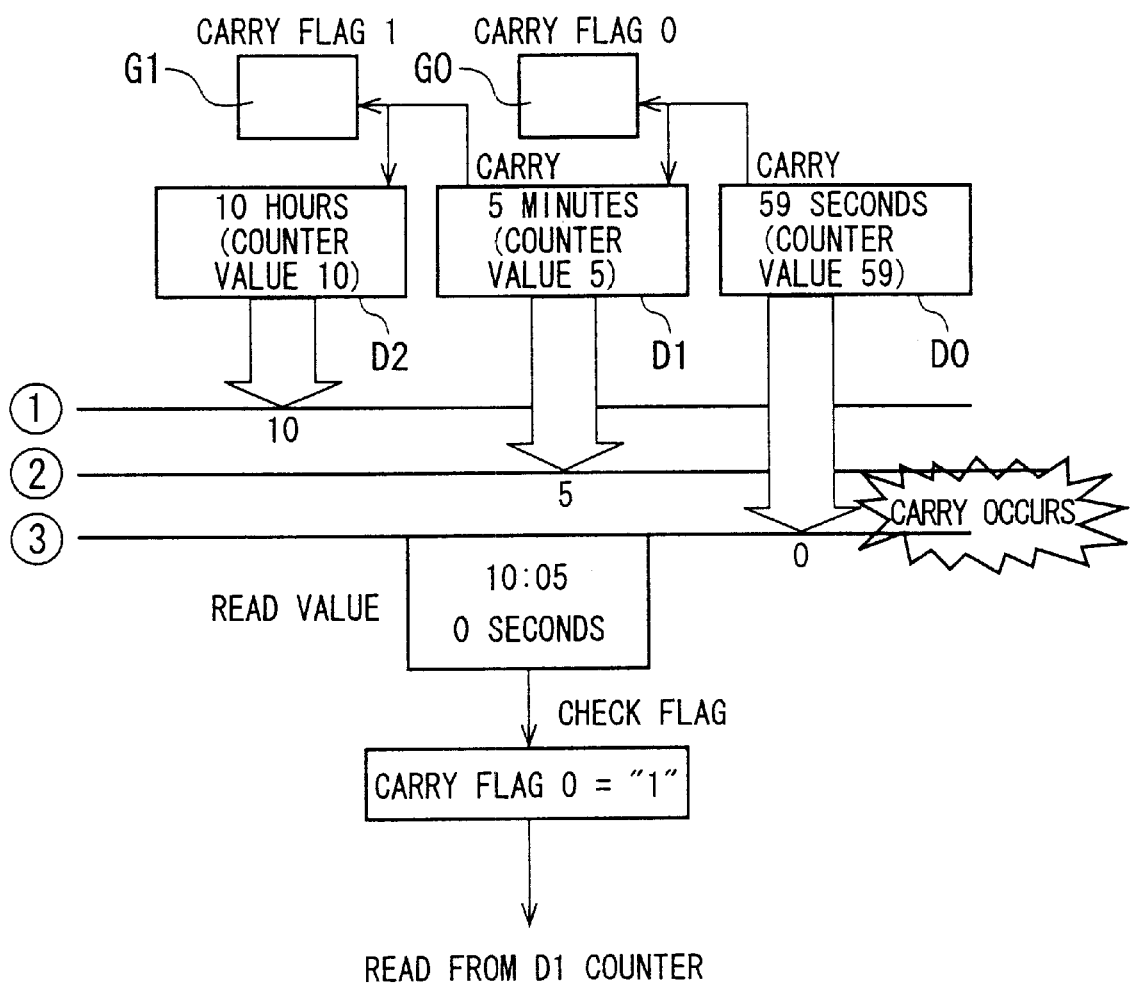
FIG. 3 is a drawing illustrating the first embodiment of the present invention.

A specific example of the above-noted embodiment is described below, with reference made to FIG. 3.

For example, in the case of reading 10 hours, 5 minutes, 59 seconds, first the hour counter D2 is read. In this case, the value of the counter D2 is "10". Next, the minute counter D1 is read, and the value of the counter D1 is "5". Next, the second counter D0 is read, and it will be assumed that a carry occurs in the second counter D0. Because a carry occurs when the second counter D0 is read, the value of the second counter D0 becomes "0". For this reason, the read value becomes 10 hours, 5 minutes, and 0 seconds, which is different by 59 seconds from the correct data of 10 hours, 5 minutes, and 59 seconds. Because of this, if the carry flags G0 and G1 are checked, because the carry flag G0 is "1", by rereading counters having an order greater than the minute counter D1, that is, by rereading the minute counter D1 and the hour counter D2, it is possible to readout the correct data. When performing this re-read operation, it is desirable to reset the flag G0.

Thus, a readout control method according to the first embodiment has a first step of resetting each flag storing memory F0 to Fn−1 in which a carry of each counter C0 to Cn, with an exception of an uppermost-order counter Cn, is stored, a second step of sequentially reading out the plurality of counters from an upper-order counter Cn to a lower-order counter C0, a third step of, after reading each counter value by means of the second means, testing as to whether the carry is set or not in the flag storing memory F0 to Fn−1, and a fourth step of, in the case in which the carry is set in the flag storing memory F0 to Fn−1, resetting the flag storing memory having the carry and performing a re-read operation only of counters having an order higher than an order of a counter which has been changed due to a reception of the carry.

Figure 4:
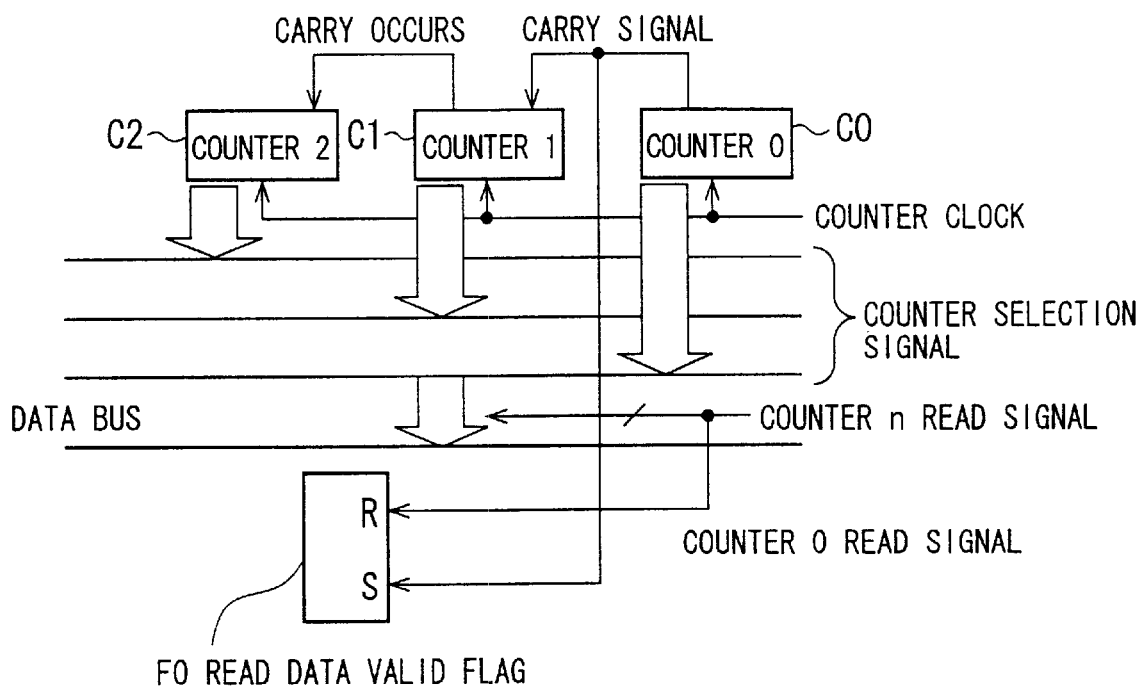
FIG. 4 is a block diagram showing a second embodiment of the present invention.
Figure 5:
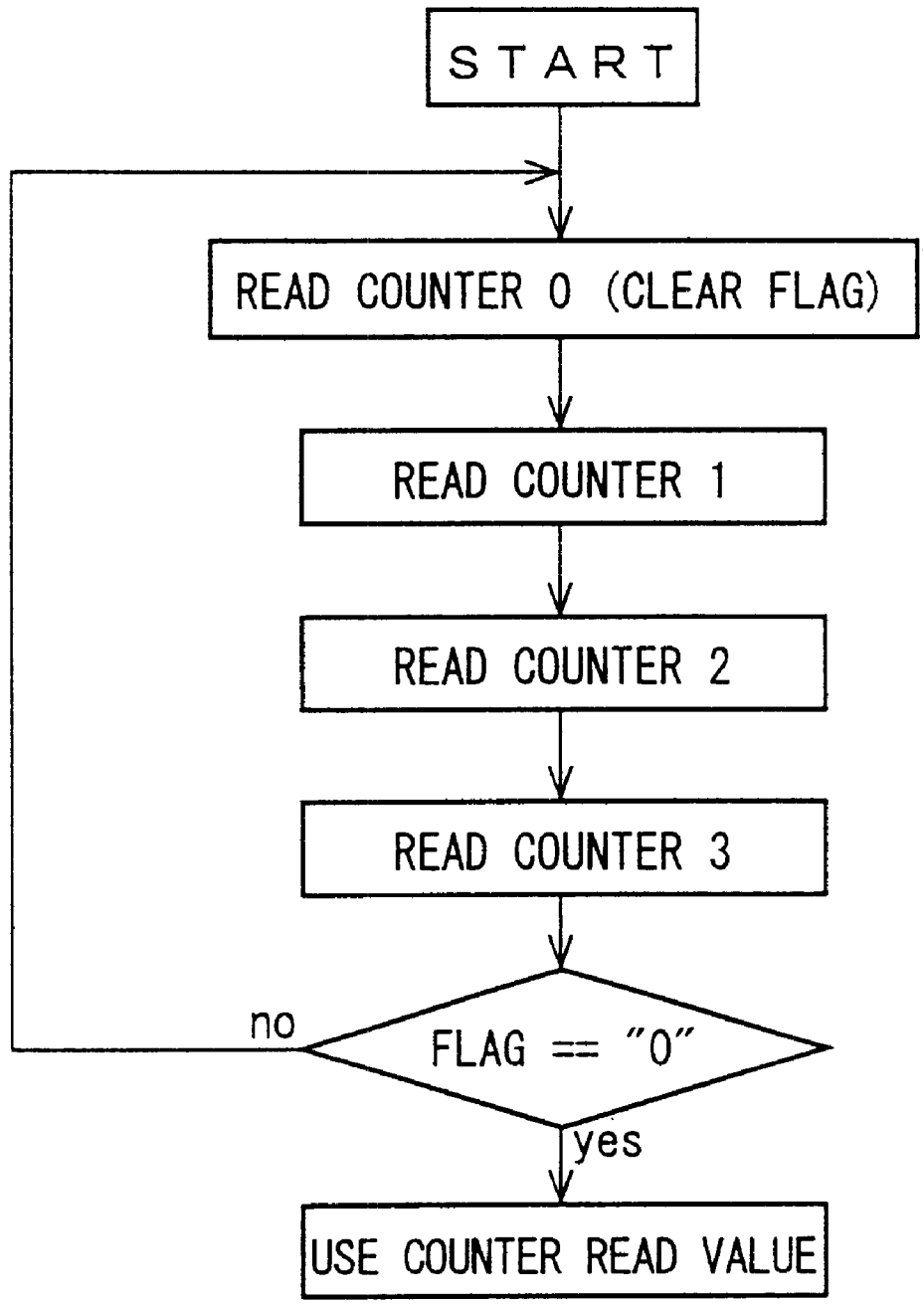
FIG. 5 is a flowchart showing the second embodiment of the present invention.

FIG. 4 and FIG. 5 shows a second embodiment of a counter readout control apparatus according to the present invention.

In this embodiment, as shown in FIG. 5, when reading the counters, reading is performed from the lowermost-order counter C0 and, after all counters have been read, the read data valid flag F0 is read. In this circuit as well, in the case in which a carry signal from the lowermost-counter to an upper-order counter is active, the read data valid flag F0 is placed in the set condition. In the same manner as described for the first embodiment, immediately before reading a counter, the counter read signal clears the read data valid flag F0.

In this circuit, the read values of all counters are assured in the following case. Specifically, after reading all the counters C0 to C2, the read data valid flag F0 is read. If the value of F0 is "0", because this is the case in which a carry to an upper-order counter from the lowermost-order counter has not occurred, the count values of all counters are assured.

However, the read values of all counters are not assured in the following case.

After reading all of the counters, the read data valid flag F0 is read. If the value of F0 is "1", because this is the case in which a carry to an upper-order counter occurred from the lowermost-order counter, the count value of all counters is not assured, in which case a series of counter re-read operations is performed.

By adopting the above-described constitution, a counter readout control apparatus and control method therefor according to the present invention reduce the burden on software, and enable high-accuracy counter value readout.

What is claimed is:

1. A counter readout control apparatus comprising a plurality of counters, in which each upper-order counter performs a counting operation upon receiving a carry signal from a lower-order counter, and a plurality of flag storing memories, each said flag storing memory storing a carry signal from a counter, with an exception of an uppermost-order counter, said apparatus further comprising:

a first means for resetting each said flag storing memory, a second means for sequentially reading out said plurality of counters from an uppermost-order counter to a lowermost-order counter, a third means for, after reading each counter value by means of said second means, testing as to whether each said carry signal is set or not in each said flag storing memory, and a fourth means for, in the case in which one of said carry signals is set in one of said flag storing memories, resetting said flag storing memory having said set carry signal and performing a re-read operation only of counters having an order higher than an order of a counter which has been changed due to a reception of said carry signal.

2. A counter readout control method for a counter comprising a plurality of counters, in which each upper-order counter performs a counting operation upon receiving a carry signal from a lower-order counter, and a plurality of flag storing memories, each said flag storing memory storing a carry signal from a counter, with an exception of an uppermost-order counter, said method comprising:

a first step of resetting each said flag storing memory, a second step of sequentially reading out said plurality of counters from an uppermost-order counter to a lowermost-order counter, a third step of, after reading each counter value by means of said second step, testing as to whether each said carry signal is set or not in each said flag storing memory, and a fourth step of, in the case in which one of said carry signals is set in one of said flag storing memories, resetting said flag storing memory having said set carry signal and performing a re-read operation only of counters having an order higher than an order of a counter which has been changed due to a reception of said carry signal.

* * * * *